(12) United States Patent
Hu

(10) Patent No.: US 10,290,586 B2
(45) Date of Patent: May 14, 2019

(54) PACKAGE SUBSTRATE WITH EMBEDDED NOISE SHIELDING WALLS

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 0 days.

(21) Appl. No.: 15/487,647

(22) Filed: Apr. 14, 2017

(65) Prior Publication Data

US 2017/0345771 A1 Nov. 30, 2017

Related U.S. Application Data

(60) Provisional application No. 62/340,611, filed on May 24, 2016.

(51) Int. Cl.
*H01L 23/552* (2006.01)
*H01L 23/538* (2006.01)
*H01L 23/00* (2006.01)
*H01L 25/065* (2006.01)

(52) U.S. Cl.
CPC ........ *H01L 23/552* (2013.01); *H01L 23/5383* (2013.01); *H01L 24/16* (2013.01); *H01L 25/0655* (2013.01); *H01L 2224/16227* (2013.01); *H01L 2924/15192* (2013.01); *H01L 2924/15311* (2013.01); *H01L 2924/3025* (2013.01)

(58) Field of Classification Search
CPC ..... H01L 23/55; H01L 23/53; H01L 23/5383; H01L 24/16; H01L 23/552
USPC .............................. 257/659; 438/37, 46, 472
See application file for complete search history.

(56) References Cited

U.S. PATENT DOCUMENTS

| | | | |
|---|---|---|---|
| 7,638,881 B2 | 12/2009 | Chang et al. | |
| 9,269,887 B1* | 2/2016 | Juskey | H01L 25/16 |
| 9,287,250 B2* | 3/2016 | Inagaki | H01L 25/18 |
| 2001/0013422 A1* | 8/2001 | Schaper | H01L 23/5383 |
| | | | 174/250 |
| 2002/0015293 A1* | 2/2002 | Akiba | H01L 23/5383 |
| | | | 361/793 |
| 2002/0079572 A1* | 6/2002 | Khan | H01L 23/3677 |
| | | | 257/707 |
| 2002/0086561 A1* | 7/2002 | Ogawa | H01L 23/49822 |
| | | | 439/55 |
| 2003/0151133 A1* | 8/2003 | Kinayman | H01L 23/055 |
| | | | 257/713 |
| 2004/0090758 A1* | 5/2004 | Horikawa | H01L 23/49816 |
| | | | 361/782 |
| 2005/0218502 A1* | 10/2005 | Sunohara | H01L 23/49822 |
| | | | 257/700 |
| 2009/0008765 A1* | 1/2009 | Yamano | H01L 24/83 |
| | | | 257/690 |
| 2011/0147059 A1* | 6/2011 | Ma | H01L 23/49822 |
| | | | 174/258 |
| 2012/0286415 A1* | 11/2012 | Sakai | H01L 24/97 |
| | | | 257/734 |
| 2013/0050972 A1* | 2/2013 | Mohammed | H05K 3/4602 |
| | | | 361/807 |
| 2013/0134553 A1* | 5/2013 | Kuo | H01L 23/552 |
| | | | 257/532 |

(Continued)

*Primary Examiner* — Sheikh Maruf
(74) *Attorney, Agent, or Firm* — JCIPRNET

(57) ABSTRACT

A package substrate with embedded noise shielding walls is disclosed. One of the embodiment comprises a signal line S sandwiched by a left shielding wall W1 and a right shielding wall W2. The signal line S, left shielding wall W1, and the right shielding wall W2 are embedded in a dielectric layer.

9 Claims, 9 Drawing Sheets

(56) References Cited

U.S. PATENT DOCUMENTS

| | | | |
|---|---|---|---|
| 2013/0168134 A1* | 7/2013 | Tominaga | H05K 3/4673 174/251 |
| 2013/0307162 A1* | 11/2013 | Shizuno | H01L 23/49827 257/774 |
| 2014/0003009 A1* | 1/2014 | Ma | H01L 21/486 361/757 |
| 2014/0085842 A1* | 3/2014 | Yang | H01L 23/49811 361/760 |
| 2014/0091440 A1* | 4/2014 | Nair | H01L 23/5383 257/659 |
| 2014/0102768 A1* | 4/2014 | Shizuno | H01L 24/14 174/251 |
| 2014/0268614 A1* | 9/2014 | Zhang | H01L 21/768 361/782 |
| 2014/0301058 A1* | 10/2014 | Sunohara | H01L 23/49822 361/783 |
| 2014/0353828 A1* | 12/2014 | Edelstein | H01L 21/76885 257/751 |
| 2014/0367160 A1* | 12/2014 | Yu | H01L 21/568 174/377 |
| 2015/0028477 A1* | 1/2015 | Jung | H01L 24/13 257/738 |
| 2015/0084208 A1* | 3/2015 | Iida | H01L 23/49822 257/774 |
| 2015/0137338 A1* | 5/2015 | Lin | H01L 23/49816 257/676 |
| 2015/0179616 A1* | 6/2015 | Lin | H01L 25/50 257/773 |
| 2015/0357316 A1* | 12/2015 | Inagaki | H01L 25/18 257/774 |
| 2016/0035678 A1* | 2/2016 | Yoo | H01L 23/552 257/659 |
| 2016/0071805 A1* | 3/2016 | Kuo | H01L 23/552 257/659 |
| 2016/0260695 A1* | 9/2016 | Chung | H01L 21/565 |
| 2017/0040266 A1* | 2/2017 | Lin | H01L 23/5383 |
| 2017/0040304 A1* | 2/2017 | Shih | H01L 25/16 |
| 2017/0047293 A1* | 2/2017 | Moon, III | H01L 23/544 |
| 2017/0117200 A1* | 4/2017 | Kim | H01L 21/561 |
| 2017/0125356 A1* | 5/2017 | Yang | H01L 23/3142 |
| 2017/0176392 A1* | 6/2017 | Tago | G01N 29/043 |
| 2017/0345793 A1* | 11/2017 | Miyairi | H01L 24/96 |
| 2018/0019209 A1* | 1/2018 | Chang | H01L 25/0657 |
| 2018/0026022 A1* | 1/2018 | Lee | H01L 21/561 257/659 |
| 2018/0092201 A1* | 3/2018 | Otsubo | H05K 9/003 |
| 2018/0092257 A1* | 3/2018 | Otsubo | H05K 9/0024 |
| 2018/0247905 A1* | 8/2018 | Yu | H01Q 9/0457 |

\* cited by examiner

PACKAGE SUBSTRATE WITH EMBEDDED NOISE SHIELDING WALLS

RELATED APPLICATIONS

The present application claims the benefit of U.S. Provisional Application No. 62/340,611, Filed May 24, 2016, the disclosure of which is hereby incorporated by reference herein in its entirety.

BACKGROUND

Technical Field

The present invention relates to a package substrate, especially relates to a package substrate with embedded noise shielding walls, wherein at least one signal line is sandwiched between two shielding walls.

Description of Related Art

FIG. 1 shows a prior art.

FIG. 1 is U.S. Pat. No. 7,638,881, which shows a conventional chip package 100 includes a chip 110, a package substrate 120, a plurality of bumps 130, and an interface metal layer 140. The chip 110 has a plurality of chip pads 112 disposed on a surface 114 of the chip 110. The package substrate 120 has a plurality of first substrate pads 122, a plurality of second substrate pads 124, and a surface bonding layer 126. The first substrate pads 122 and the second substrate pads 124 are disposed on a surface 128 of the package substrate 120. The surface bonding layer 126 (the material thereof is Sn) is disposed on the first substrate pads 122 and the second substrate pads 124, and the layer 126 also completely covers the first substrate pads 122 and the second substrate pads 124. The bumps 130 are respectively disposed between the chip pads 112 and the surface bonding layer 126. The interface metal layer 140 is disposed between the bumps 130 and the surface bonding layer 126. The chip 110 is electrically connected to the package substrate 120 through the bumps 130.

The signal lines in the package substrate are more and more compact with the development of semiconductor package technology, cross-talk noise between compact signal lines becomes a serious problem.

The disadvantage for the prior art is that it did not disclose any noise shielding walls for a signal line.

BRIEF DESCRIPTION OF THE DRAWINGS

FIG. 5A shows the first shielding type E11 without showing the dielectric layer according to the present invention.

FIG. 5B shows the second shielding type E12 without showing the dielectric layer according to the present invention.

DETAILED DESCRIPTION OF THE INVENTION

Figure 1:
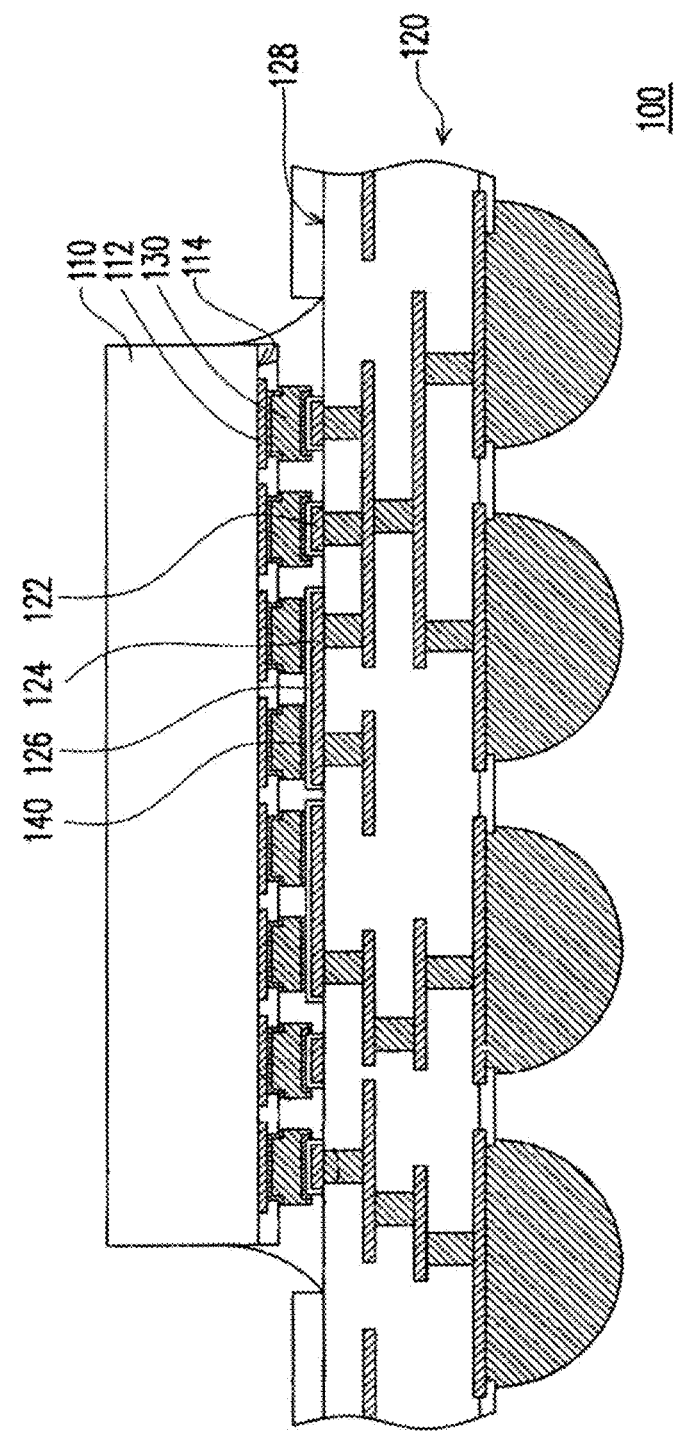
FIG. 1 shows a prior art.
Figure 2A:
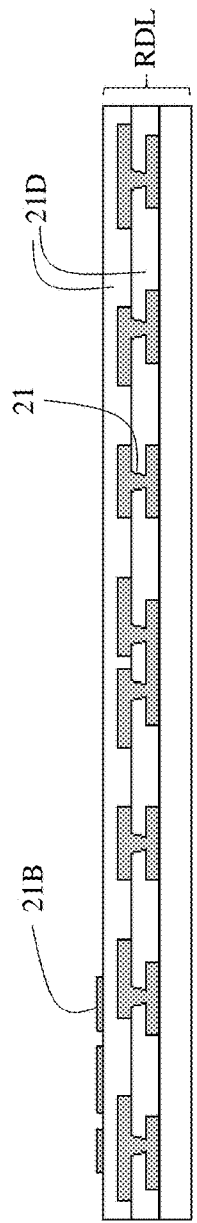
FIG. 2A, FIG. 2B, FIG. 2C, FIG. 3A, FIG. 3B, FIG. 3C and FIG. 4 shows fabricating process for embodiments according to the present invention.
Figure 2B:
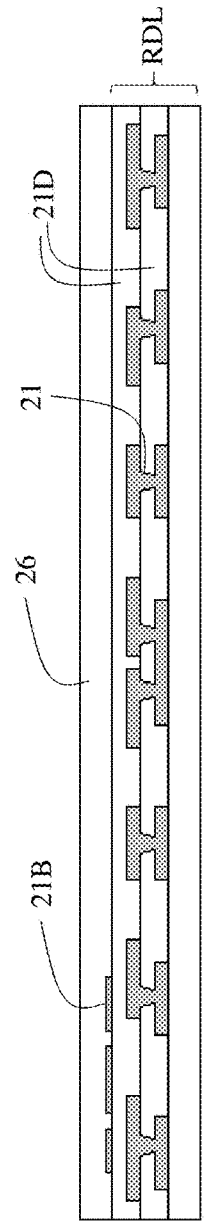
Figure 2C:
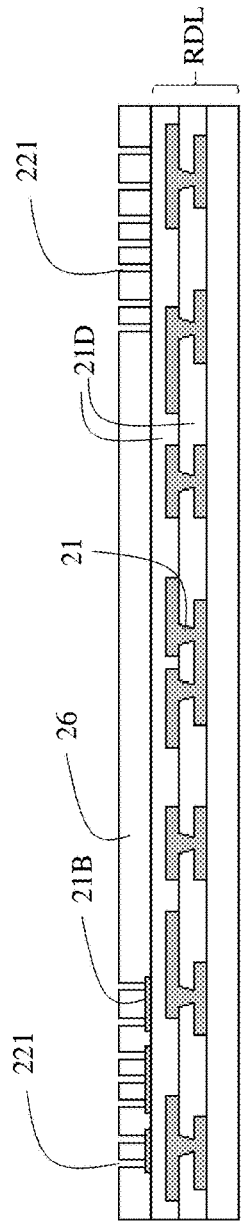
Figure 3A:
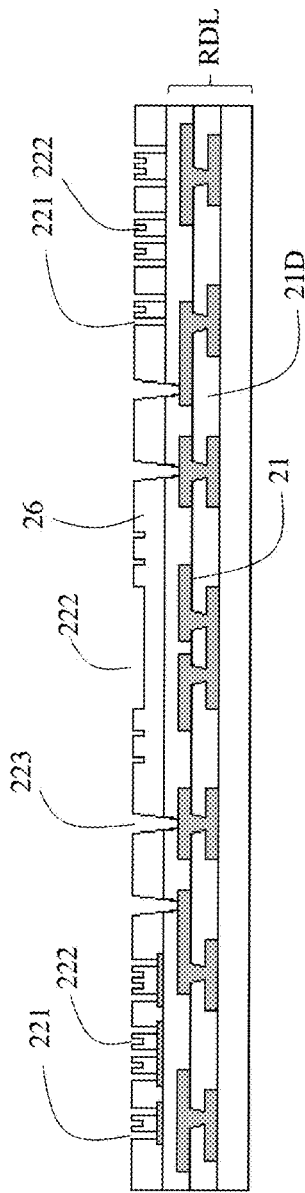
Figure 3B:
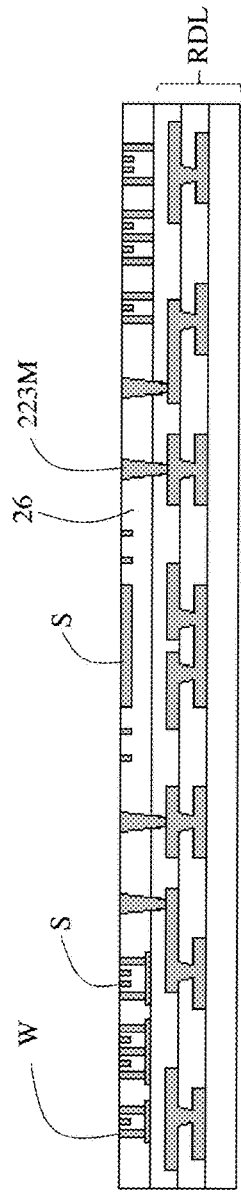
Figure 3C:
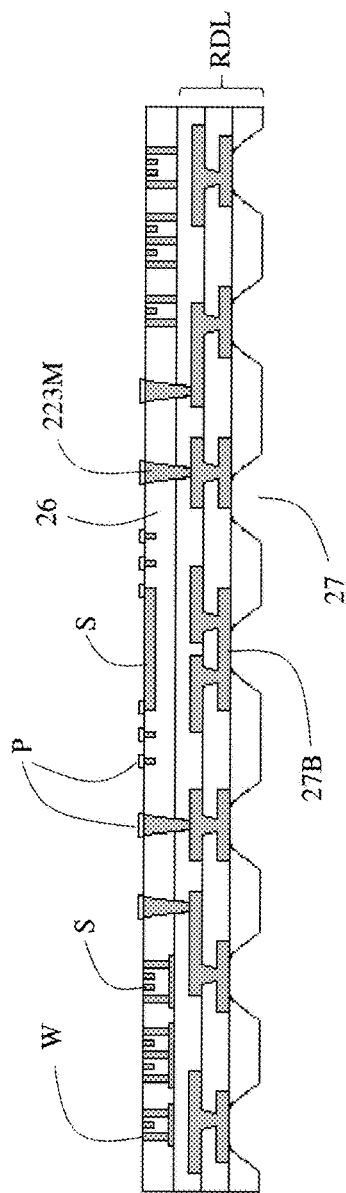

FIG. 2A, FIG. 2B, FIG. 2C, FIG. 3A, FIG. 3B, FIG. 3C and FIG. 4 shows fabricating process for embodiments according to the present invention.

FIG. 2A shows:

preparing a redistribution layer (RDL) with patterned metals 21B on top surface of the RDL; the RDL has a circuitry 21 embedded in dielectric layers 21D.

FIG. 2B shows:

applying a first dielectric layer 26 on top of the patterned metal 21B.

FIG. 2C shows:

etching a plurality of first trenches 221 from a top of the first dielectric layer 26. The first dielectric layer 26 can be one of, for example, photosensitive material. The plurality of first trenches 221 are made for fabricating noise shielding walls W in a later step.

FIG. 3A shows:

etching a plurality of second trenches 222 between two first trenches 221 the first trenches 221 has a depth no less than a depth of the second trenches 222; the etching can be one of, for example, laser etching process; and etching a plurality of third trenches 223, the third trenches 223 are passing through the first dielectric layer 26 for making metal contacts which is prepared to electrically couple chips to the circuitry of the bottom redistribution layer (RDL); the etching process can be one of, for example, laser etching process.

The plurality of second trenches 222 are made for fabricating signal lines S in a later step. The plurality of third trenches 223 are made for fabricating metal contacts 223M in a later step.

FIG. 3B shows:

filling metal in each of the first trenches 221 to form a plurality of noise shielding walls W; filling metal in each of the second trenches 222 to form a plurality of signal lines S; and filling metal in each of the third trenches 223 to form a plurality of metal contacts 223M.

FIG. 3C shows:

forming a plurality of metal pads P on tops of corresponding single lines S and metal contacts 223M; and forming a plurality of openings 27, each opening 27 exposes a bottom surface of a corresponding bottom metal pad 27B of the circuitry of the redistribution layer RDL.

FIG. 4 shows:

mounting chips 201, 202 on top of the first dielectric layer 26, so that the chips are electrically coupled to a circuitry of the redistribution layer RDL through corresponding metal pads P; and planting a plurality of solder balls 28, each solder ball 28 is configured on a bottom surface of a metal pad in a corresponding opening 27.

Figure 4:
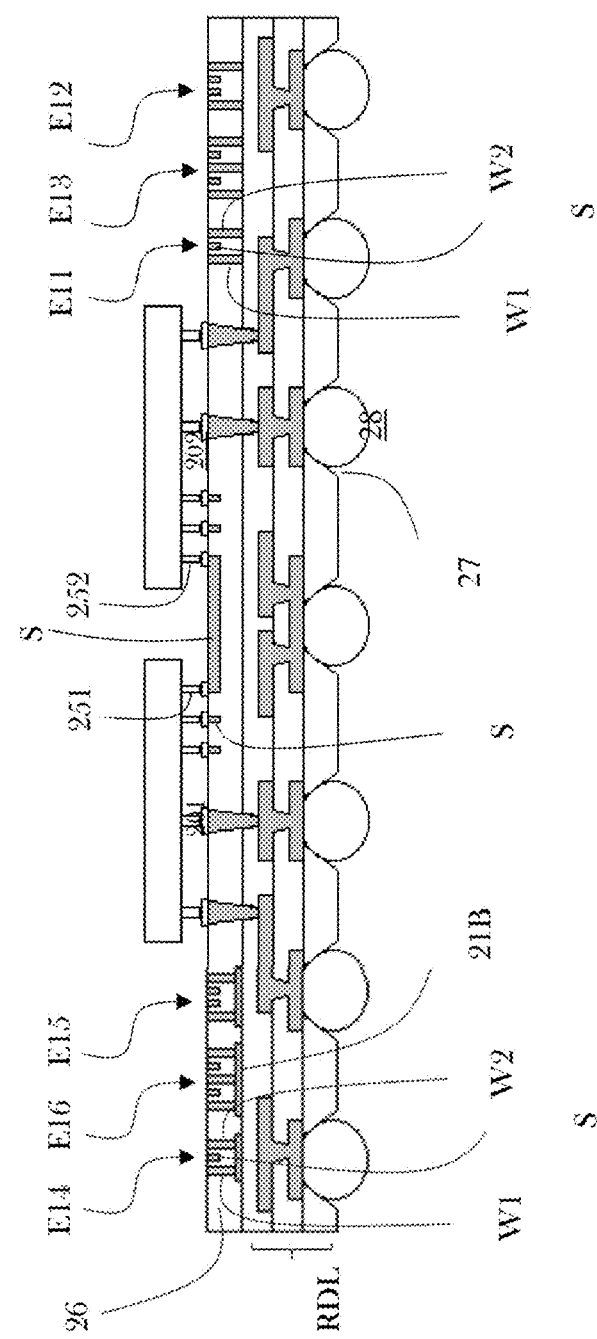

Six noise shielding types E1-E16 are disclosed in FIG. 4 and described as follows:

a first noise shielding type E11 shows a signal line S sandwiched by a left shielding wall W1 and a right shielding wall W2; and similarly, a second noise shielding type E12 shows two signal line S sandwiched by a left shielding wall and a right shielding wall; and similarly, a third noise shielding type E13 shows a signal line S sandwiched by a left shielding wall and a right shielding wall; and a further signal line S is sandwiched by the right shielding wall and a further right wall.

A fourth noise shielding type E14 shows a bottom shielding wall 21B is configured on a bottom side of the two shielding walls W1, W2; and similarly, a fifth noise shielding type E15 shows a bottom shielding wall 21B is configured on a bottom side of the two shielding walls; and similarly, a sixth noise shielding type E16 shows a bottom shielding wall 21B is configured on a bottom side of the three shielding walls.

FIG. 5A shows the first shielding type E11 without showing the dielectric layer.

FIG. 5A shows a signal line S is sandwiched between a left shielding wall W1 and a right shielding wall W2. The two shielding walls W1, W2 are electrically coupled to ground.

FIG. 5B shows the second shielding type E12 without showing the dielectric layer.

FIG. 5B shows a pair of signal lines S1, S2 are sandwiched between a left shielding wall W1 and a right shielding wall W2. The two shielding walls W1, W2 are electrically coupled to ground.

Figure 6B:
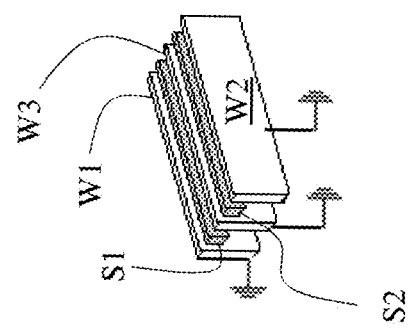
FIG. 6B shows the fourth shielding type E14 without showing the dielectric layer according to the present invention.
Figure 6A:
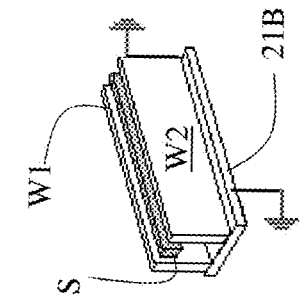
FIG. 6A shows the third shielding type E13 without showing the dielectric layer according to the present invention.

FIG. 6A shows the third shielding type E13 without showing the dielectric layer.

FIG. 6A shows a first signal line S1 is sandwiched between a left shielding wall W1 and a middle shielding wall W3. A second signal line S2 is sandwiched between the middle shielding wall W3 and a right shielding wall W2. The three shielding walls W1, W2, and W3 are electrically coupled to ground.

FIG. 6B shows the fourth shielding type E14 without showing the dielectric layer.

FIG. 6B shows a bottom shielding wall 21B is configured on a bottom side of the two shielding walls W1, W2. The two shielding walls W1, W2 and the bottom shielding wall 21B are electrically coupled to ground.

Figure 7A:
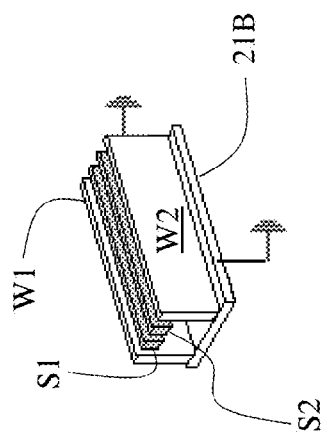
FIG. 7A shows the fifth shielding type E15 without showing the dielectric layer according to the present invention.

FIG. 7A shows the fifth shielding type E15 without showing the dielectric layer. FIG. 7A shows a bottom shielding wall 21B is configured on a bottom side of the two shielding walls W1, W2. The two shielding walls W1, W2 and the bottom shielding wall 21B are electrically coupled to ground.

Figure 7B:
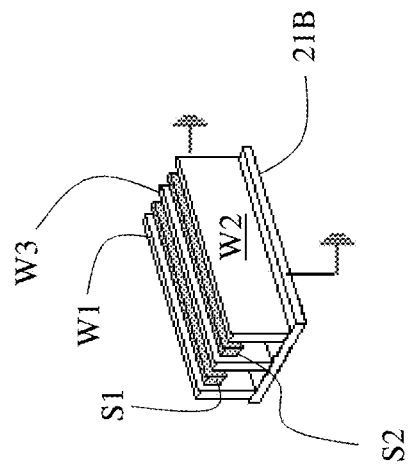
FIG. 7B shows the sixth shielding type E16 without showing the dielectric layer according to the present invention.

FIG. 7B shows the sixth shielding type E16 without showing the dielectric layer.

FIG. 7B shows a bottom shielding wall 21B is configured on a bottom side of the three shielding walls W1, W2, W3. The three shielding walls W1, W2, W3, and the bottom shielding wall 21B are electrically coupled to ground.

Figure 8:
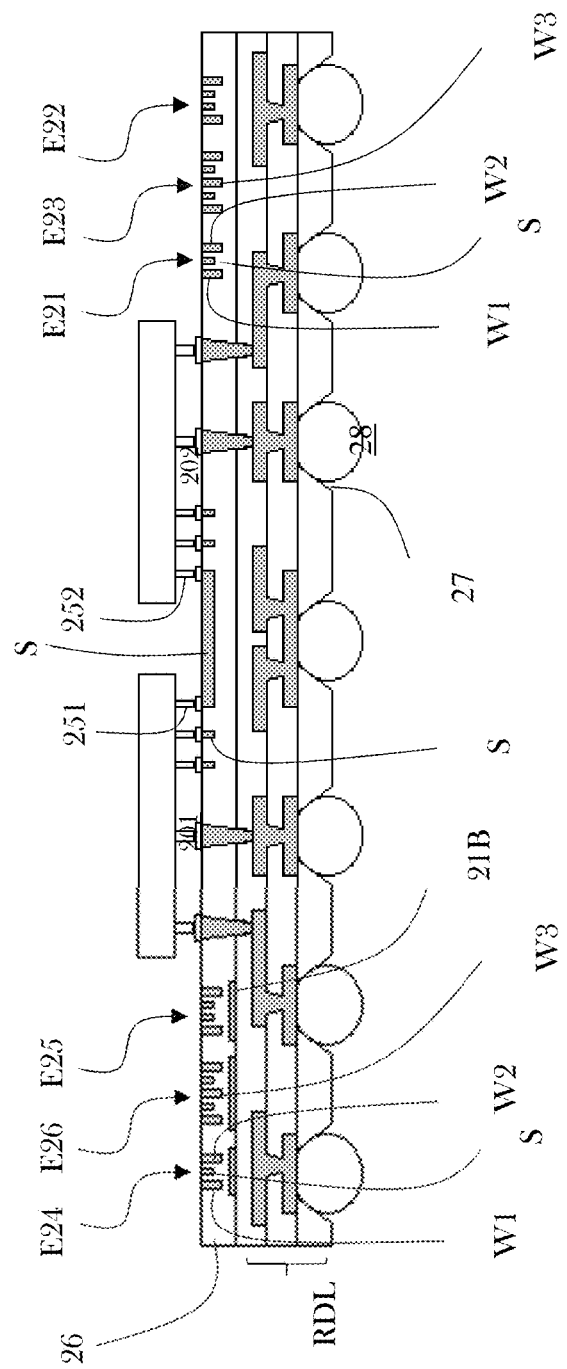
FIG. 8 shows modified version of the noise shielding types according to the present invention.

FIG. 8 shows modified version of the noise shielding types.

FIG. 8 shows the shielding walls W1, W2, W3 do not contact the bottom shielding wall 21B. This is when laser etching is adopted, the depth of the trenches 221, 222 to etch, which determining the height of the shielding walls W1, W2, W3, can be adjusted according to a predetermined pattern.

Figure 9:
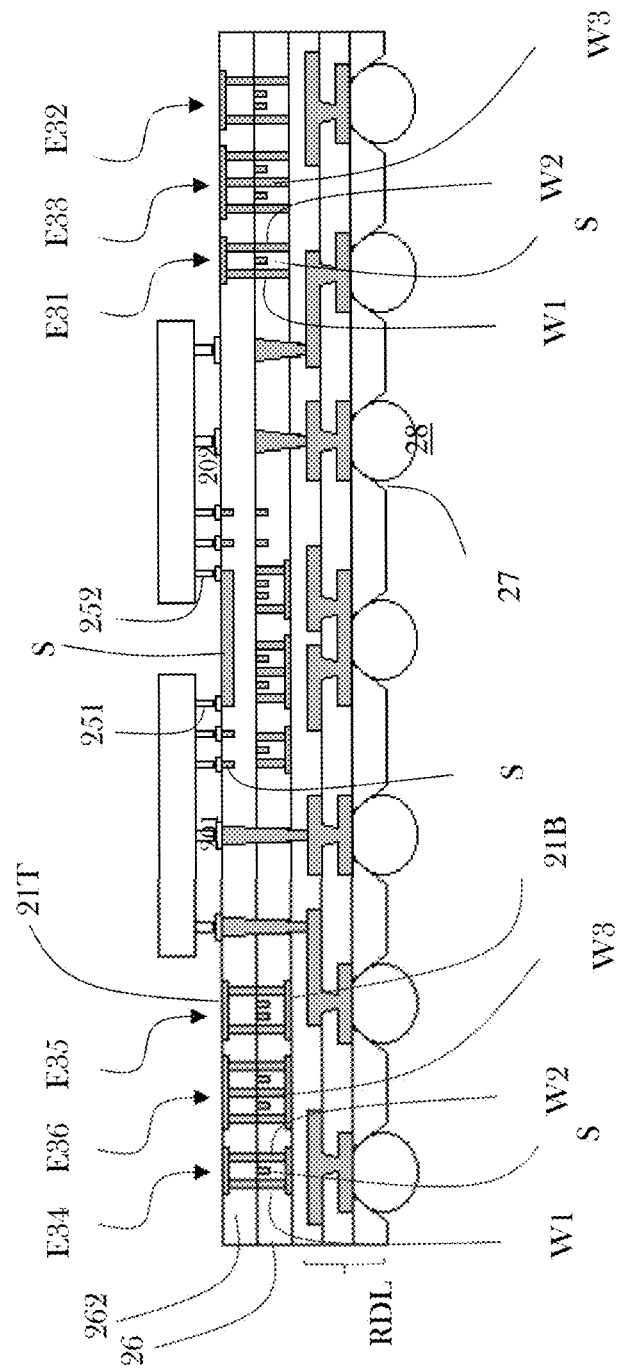
FIG. 9 shows further modified version of the noise shielding types according to the present invention.

FIG. 9 shows further modified version of the noise shielding types.

FIG. 9 shows a second dielectric layer 262 is configured on a top surface of the first dielectric layer 262. By using similar process as described in the previous section of this invention disclose, the shielding walls W1, W2, W3 extend upwards and have top surfaces higher than top surfaces of the signal lines S. A top shielding wall 21T is then configured on top of the shielding walls W1, W2, W3. In this embodiment, the signal line S is four sides noise shielded.

While several embodiments have been described by way of example, it will be apparent to those skilled in the art that various modifications may be configured without departs from the spirit of the present invention. Such modifications are all within the scope of the present invention, as defined by the appended claims.

| Numerical system |
| --- |
| chips 201, 202 |
| electric circuitry 21 |
| patterned metals 21B |
| dielectric layer 21D, 26, 262 |
| trenches 221, 222, 223 |
| metal contacts 223M |
| openings 27 |
| bottom metal pad 27B |
| solder balls 28 |
| redistribution layer RDL |
| signal line S, S1, S2 |
| shielding wall W, W1, W2, W3, 21B, 21T |

What is claimed is:

1. A package substrate with embedded noise shielding walls, comprises:

a first signal line, embedded in a first dielectric layer;

a left shielding wall, embedded in the first dielectric layer and configured on a left side of the first signal line, wherein the left shielding wall extents upwards to have a top surface higher than a top surface of the first signal line;

a right shielding wall, embedded in the first dielectric layer and configured on a right side of the first signal line, wherein the right shielding wall extents upwards to have a top surface higher than the top surface of the first signal line;

a bottom shielding wall, configured on bottom sides of the left shielding wall and the right shielding wall, wherein the left shielding wall, the right shielding wall, and the bottom shielding wall are electrically coupled to ground; and a top metal wall, configured on top sides of the left shielding wall and the right shielding wall, wherein the top shielding wall, the left shielding wall, the right shielding wall and the bottom shielding wall can form a four-sided closed structure, and the first signal line is disposed in the four-sided closed structure.

2. A package substrate with embedded noise shielding walls as claimed in claim 1, wherein
the left shielding wall having a bottom surface no higher than a bottom surface of the first signal line; and
the right shielding wall having a bottom surface no higher than the bottom surface of the first signal line.

3. A package substrate with embedded noise shielding walls as claimed in claim 1, further comprising:
a redistribution layer, configured on a bottom surface of the first dielectric layer; and
a chip, configured on top of the package substrate; the chip is electrically coupled to a circuitry of the redistribution layer through a plurality of metal contacts passing through the first dielectric layer.

4. A package substrate with embedded noise shielding walls as claimed in claim 1, further comprises:
a second signal line, embedded in the first dielectric layer, configured side by side with the first signal line;
the left shielding wall is configured on left side of the first signal line; and
the right shielding wall is configured on right side of the second signal line.

5. A package substrate with embedded noise shielding walls as claimed in claim 4, further comprises:
a middle shielding wall, configured in between the first signal line and the second signal line.

6. A package substrate with embedded noise shielding walls as claimed in claim 4, wherein
the left shielding wall extents upwards to have a top surface higher than a top surface of the first signal line, and
the right shielding wall extents upwards to have a top surface higher than the top surface of the first signal line.

7. A package substrate with embedded noise shielding walls as claimed in claim 6, further comprises:
a top metal wall, configured on top sides of the left shielding wall and the right shielding wall.

8. A package substrate with embedded noise shielding walls as claimed in claim 5, wherein
the left shielding wall extents upwards to have a top surface higher than a top surface of the first signal line,
the middle shielding wall extents upwards to have a top surface higher than the top surface of the first signal line; and
the right shielding wall extents upwards to have a top surface higher than the top surface of the first signal line.

9. A package substrate with embedded noise shielding walls as claimed in claim 8, further comprises:
a top metal wall, configured on top sides of the left shielding wall, middle shielding wall, and the right shielding wall.

\* \* \* \* \*